(12) United States Patent
Bhagavatula et al.

(10) Patent No.: US 8,036,508 B2
(45) Date of Patent: Oct. 11, 2011

(54) METHODS FOR PASSIVELY ALIGNING OPTO-ELECTRONIC COMPONENT ASSEMBLIES ON SUBSTRATES

(75) Inventors: Venkata Adiseshaiah Bhagavatula, Big Flats, NY (US); Satish Chandra Chaparala, Painted Post, NY (US); John Himmelreich, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 248 days.

(21) Appl. No.: 12/563,449

(22) Filed: Sep. 21, 2009

(65) Prior Publication Data

US 2011/0069929 A1    Mar. 24, 2011

(51) Int. Cl.
*G02B 6/42* (2006.01)
*G02B 6/36* (2006.01)

(52) U.S. Cl. .............. 385/52; 385/88; 385/14

(58) Field of Classification Search .......... 385/14, 385/52, 88, 89, 92, 93, 94; 438/26, 27, 29, 438/31
See application file for complete search history.

(56) References Cited

U.S. PATENT DOCUMENTS

| | | | |
|---|---|---|---|
| 4,322,127 A | 3/1982 | Comerford et al. | 385/65 |
| RE38,025 E | 3/2003 | Skunes et al. | 356/400 |
| 6,603,093 B2* | 8/2003 | Epitaux et al. | 219/121.64 |
| 6,718,233 B2 | 4/2004 | Sakhitab et al. | 700/259 |
| 6,838,689 B1* | 1/2005 | Deng et al. | 250/559.3 |
| 7,150,569 B2 | 12/2006 | Oono et al. | 385/88 |
| 7,223,629 B2* | 5/2007 | Zheng et al. | 438/106 |
| 7,409,125 B2 | 8/2008 | Azimi et al. | 385/52 |
| 7,419,311 B2 | 9/2008 | Terashima et al. | 385/88 |
| 7,437,038 B2 | 10/2008 | Rosenberg | 385/52 |
| 7,511,258 B2 | 3/2009 | Bowen et al. | 250/216 |
| 7,548,673 B2 | 6/2009 | Azimi et al. | 385/2 |
| 7,558,453 B2 | 7/2009 | Steegmuller et al. | 385/52 |
| 2002/0062170 A1 | 5/2002 | Skunes et al. | 700/229 |
| 2002/0168147 A1 | 11/2002 | Case et al. | 385/53 |
| 2003/0029051 A1* | 2/2003 | Epitaux et al. | 33/645 |
| 2006/0072883 A1* | 4/2006 | Kilian et al. | 385/93 |
| 2008/0253423 A1* | 10/2008 | Kopp | 372/50.124 |
| 2011/0069929 A1* | 3/2011 | Bhagavatula et al. | 385/88 |

FOREIGN PATENT DOCUMENTS

| EP | 0226296 | 6/1987 |
|---|---|---|
| JP | 62157004 | 7/1987 |

* cited by examiner

*Primary Examiner* — Brian Healy
(74) *Attorney, Agent, or Firm* — Svetlana Z. Short

(57) ABSTRACT

A method for aligning an opto-electronic component assembly (OECA) on a substrate includes positioning a substrate on an assembly surface and positioning an OECA on the substrate such that a first OECA alignment face projects from a first substrate alignment face. The substrate and the OECA are advanced towards a contact face of a first assembly alignment mechanism such that the first substrate alignment face contacts the contact face of the first assembly alignment mechanism after the first OECA alignment face contacts the contact face. The OECA is displaced relative to the first substrate alignment face when the first OECA alignment face contacts the contact face and the substrate continues to move towards the contact face thereby aligning the OECA on the substrate relative to the first substrate alignment face.

20 Claims, 5 Drawing Sheets

METHODS FOR PASSIVELY ALIGNING OPTO-ELECTRONIC COMPONENT ASSEMBLIES ON SUBSTRATES

BACKGROUND

1. Field

The present specification generally relates to methods for aligning optical component assemblies and, more specifically, to methods for aligning opto-electronic component assemblies on substrates.

2. Technical Background

Opto-electronic component assemblies have a variety of applications in both consumer and industrial electronics. For example, semiconductor laser diodes that emit visible light may be used in sensors, in high density optical storage devices and in projection displays. Further, high power semiconductor laser diodes may be used in material processing applications, patient treatment systems and free space communication systems. In addition to semiconductor laser diodes, such devices may also include additional opto-electronic components such as, for example, lenses, waveguides, and/or various other opto-electronic components that may be required to produce the desired optical output from the devices in which they are incorporated.

The opto-electronic component assemblies may typically be attached or soldered to metal or ceramic substrates to form a sub-assembly. The sub-assembly may then be incorporated into an electronic package where the sub-assembly is aligned with other sub-assemblies and the electronic package itself. In order to ensure proper functionality of the resulting device it is necessary to align the opto-electronic component assemblies with the substrates when building the sub-assembly. The required alignment precision may vary depending on the specific application. For example, for some applications the required alignment precision between the opto-electronic component assemblies and the substrates may be on the order of tens of microns while for other applications the necessary alignment precision may be less than one micron.

Accordingly, a need exists for improved methods of passively aligning opto-electronic component assemblies on substrates to achieve the desired alignment precision.

SUMMARY

According to one embodiment, a method for aligning an opto-electronic component assembly (OECA) on a substrate includes positioning a substrate on an assembly surface and positioning an OECA on the substrate such that a first OECA alignment face projects from a first substrate alignment face. Thereafter, the substrate and the OECA may be advanced towards a contact face of a first assembly alignment mechanism such that the first substrate alignment face contacts the contact face of the first assembly alignment mechanism after the first OECA alignment face contacts the contact face of the first assembly alignment mechanism. The OECA is displaced relative to the first substrate alignment face when the first OECA alignment face contacts the contact face of the first assembly alignment mechanism and the substrate continues to move towards the contact face thereby aligning the OECA on the substrate relative to the first substrate alignment face. The contact between the first substrate alignment face and the contact face of the first assembly alignment mechanism may be at least a two point contact which limits movement of the substrate on the assembly surface in more than one degree of freedom. Similarly, the contact between the first OECA alignment face and the contact face of the first assembly alignment mechanism may be at least a two point contact which limits movement of the opto-electronic component assembly on the substrate in more than one degree of freedom.

In another embodiment, a method for aligning an opto-electronic component assembly (OECA) on a substrate includes positioning the substrate on an assembly surface such that a substrate alignment face contacts a contact face of an assembly alignment mechanism and positioning the OECA on the substrate such that the OECA is substantially aligned in a first direction. Thereafter, the OECA is advanced towards the contact face of the assembly alignment mechanism until an OECA alignment face of the OECA contacts the contact face of the assembly alignment mechanism thereby aligning the OECA on the substrate in a second direction. The contact between the first substrate alignment face and the contact face of the first assembly alignment mechanism is at least a two point contact which limits movement of the substrate on the assembly surface in more than one degree of freedom. Similarly, the contact between the first OECA alignment face and the contact face of the first assembly alignment mechanism is at least a two point contact which limits movement of the OECA on the substrate in more than one degree of freedom.

Additional features and advantages of the invention will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION OF THE PREFERRED EMBODIMENTS

Figure 1:
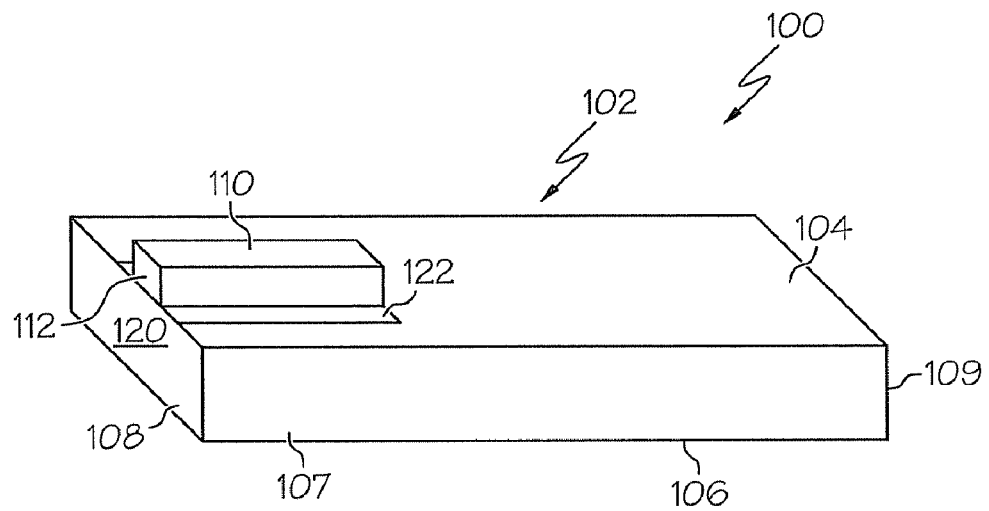
FIG. 1 depicts a sub-assembly for an optical package comprising a substrate and an opto-electronic component according to at least one embodiment shown and described herein.

FIG. 1 generally depicts a sub-assembly for an optical package aligned according to the methods described. The sub-assembly generally comprises an opto-electronic component assembly positioned on a substrate. The opto-electronic component assembly is aligned with the substrate by positioning the substrate on an assembly surface and placing the opto-electronic component assembly on the substrate. The substrate is then advanced along the assembly surface towards a first assembly alignment mechanism until the substrate and the opto-electronic component assembly contact the first assembly alignment mechanism. Reference will now be made in detail to various embodiments of the method for aligning an opto-electronic component assembly on a substrate, examples of which are illustrated in the accompanying drawings. Whenever possible, the same reference numerals will be used throughout the drawings to refer to the same or like parts.

Referring to FIG. 1, a sub-assembly 100 for an optical package is schematically illustrated. The sub-assembly 100 generally comprises a substrate 102 and an opto-electronic component assembly (OECA) 110. In one embodiment, the OECA 110 comprises a waveguide structure such as a semiconductor laser diode or similar waveguide structure. For example, the OECA 110 may comprise a distributed Bragg reflector (DBR) laser operable to emit an output beam of coherent light at a wavelength of 1060 nm. In other embodiments described herein, the OECA 110 comprises a wavelength conversion device such as a photonic crystal. For example, the OECA 110 may comprise a periodically poled lithium niobate (PPLN) second harmonic generator (SHG) photonic crystal or a similar crystal operable to convert an input beam of coherent light to a higher order harmonic output beam. The OECA 110 generally comprises at least one OECA alignment face 112 operable to form at least a two-point contact with a surface, preferably a planar surface. In the embodiment of the opto-electronic feature shown in FIG. 1, the OECA alignment face 112 is planar facet, such as an input facet or an output facet. However, it should be understood that, in other embodiments, the OECA alignment face 112 may be an edge, such as an edge formed by the intersection of two surfaces of the OECA 110.

The substrate 102 on which the OECA 110 is positioned and aligned generally comprises a plate constructed of metallic or ceramic materials. In the embodiments described herein the substrate 102 is constructed of a steel alloy. However, in other embodiments, the substrate 102 may be constructed of different alloys, ceramic materials or organic materials. The substrate of this embodiment generally comprises a planar top surface 104 on which the OECA 110 is positioned, a bottom surface 106 and a plurality of sides 107, 108, 109 extending between the top surface 104 and the bottom surface 106. The substrate 102 generally comprises at least one substrate alignment face 120 which may form at least a two-point contact with a planar surface. For example, in the embodiment shown in FIG. 1, the substrate 102 is a rectangular plate and the substrate alignment face 120 is one side (e.g., side 108) of the rectangular plate such that the first substrate alignment face 120 is planar.

While the first substrate alignment face 120 has been described herein as being planar, it should be understood that the first substrate alignment face 120 may have other configurations. For example, the substrate may be formed such that a side of the substrate has a wedge or similar projection extending from a side of the substrate and operable to form a line contact between the substrate and a planar surface. Alternatively, the first substrate alignment face 120 may be an edge of the substrate 102.

The top surface 104 of the substrate 102 includes a pad 122 of bonding material to facilitate bonding the OECA 110 to the substrate 102 following alignment. For example, the bonding material may comprise solder or a polymeric material capable of adhering to both the substrate 102 and the OECA 110.

Figure 2:
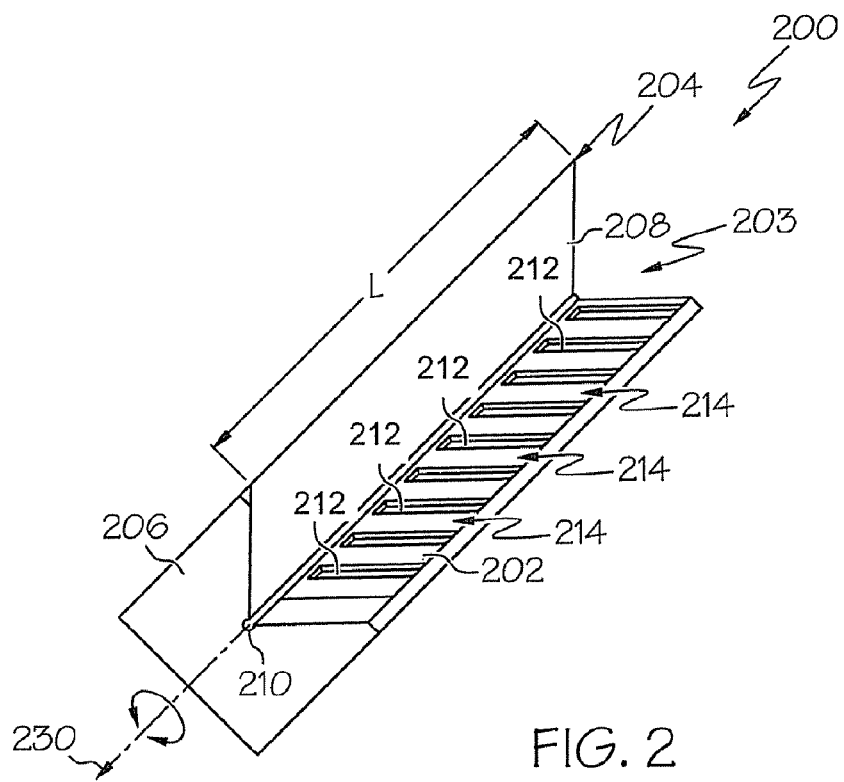
FIG. 2 depicts an alignment fixture for passively aligning an opto-electronic component assembly with a substrate according to at least one embodiment shown and described herein.
Figure 3A:
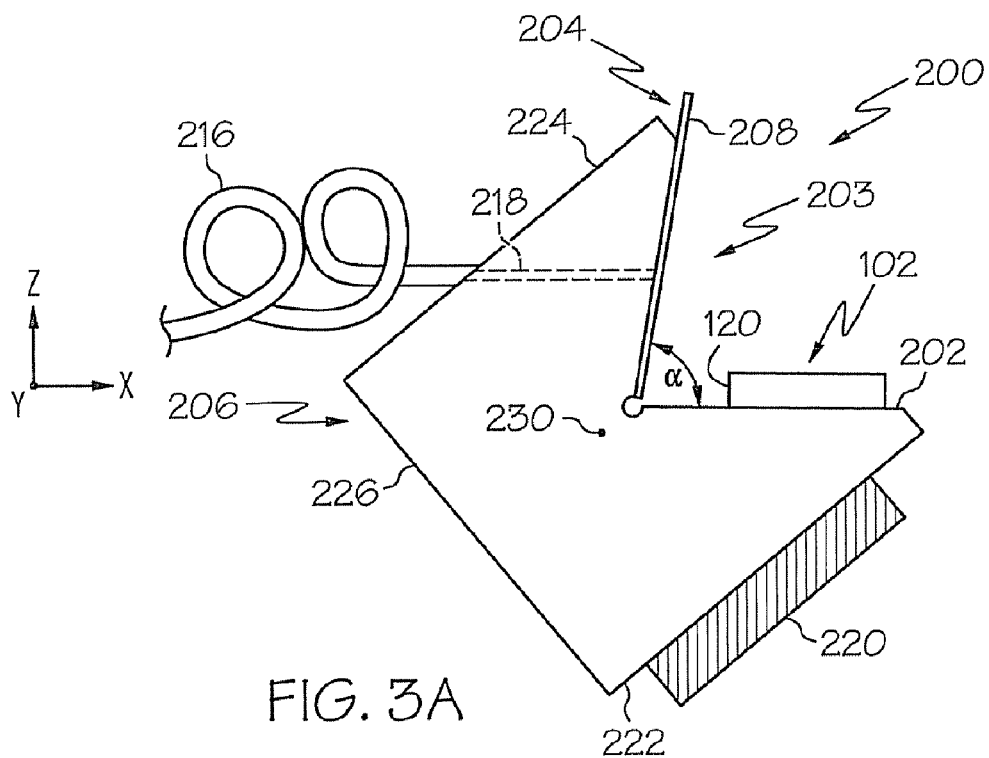
FIGS. 3A-3C schematically depict a method for using the alignment fixture of FIG. 2 to align an opto-electronic component assembly on a substrate according to at least one embodiment shown and described herein.

Referring to FIGS. 2 and 3A, an alignment fixture 200 for aligning the OECA 110 with a substrate 102 is schematically illustrated. The alignment fixture 200 generally comprises an assembly surface 202 and a first assembly alignment mechanism 204 arranged in the fixture body 206. In the embodiments shown and described herein, the fixture body 206 is machined from an aluminum alloy. However, it should be understood that the fixture body 206 may be formed from various other metals or alloys or from other materials including ceramics, carbon and/or glass.

The assembly surface 202 and the first assembly alignment mechanism 204 are generally planar and extend along a length L of the fixture body 206 on opposing sides of a V-groove 203 formed in the fixture body 206 such that a contact face 208 of the first assembly alignment mechanism 204 faces the assembly surface 202. An angle α between the contact face 208 and the assembly surface 202 may be from about 60° to about 120° to achieve the desired orientation between an OECA and a substrate, as will be described in more detail herein. The alignment fixture 200 of FIGS. 2 and 3A also comprises a semi-circular relief channel 210 formed in the fixture body 206 at the vertex of the V-groove and extending along the length L of the assembly fixture. The relief channel 210 facilitates abutting the substrate directly against the first assembly alignment mechanism at the vertex of the V-groove.

In the embodiment of the alignment fixture 200 shown in FIG. 2 the assembly surface 202 is integrally formed with the fixture body 206. However, in another embodiment (not shown) the assembly surface 202 may comprise a sheet or plate of material fixedly attached to the fixture body 206 with adhesives, soldering, fasteners or the like. Further, in the embodiment depicted in FIG. 2, the assembly surface 202 comprises a plurality of dividers 212 which separate the assembly surface into a plurality of slots 214. The dividers 212 may be integrally formed with the assembly surface 202 or, alternatively, may be discrete components fixedly attached to the assembly surface 202 with adhesive, solder or fasteners.

While the embodiment of the alignment fixture 200 shown in FIG. 2 comprises an assembly surface 202 which is separated into a plurality of slots 214 with dividers 212, in other embodiments (not shown) the assembly surface 202 does not comprise dividers (e.g., the assembly surface is a continuous plane along the length L of the alignment fixture).

Still referring to FIGS. 2 and 3A, in one embodiment the first assembly alignment mechanism 204 is a glass plate positioned on one side of the V-groove 203. The glass plate prevents the OECA 110, and, more specifically, the bonding material used to attach the OECA to the substrate, from adhering to the alignment fixture 200 during the process of aligning the OECA to the substrate. The glass plate also provides a suitably flat contact surface for aligning the OECA on the substrate. The contact face 208 preferable is flat and smooth, without any unwanted particulates or contaminants. The surface flatness should be preferably less than 25 μm, more preferably, less than 10 μm, and even more preferably, less than 1 μm. The glass plate is retained in the V-groove 203, for example, with a vacuum source 216 fluidly coupled to the V-groove via a vacuum port 218 formed in the fixture body 206. As a vacuum is drawn on the vacuum port, the glass plate is drawn to the side of the V-groove 203. In an alternative embodiment (not shown), the glass plate may be removably attached to the V-groove with one or more clips or fasteners which facilitate removal and replacement of the glass plate.

While the first assembly alignment mechanism 204 has been described herein as comprising a glass plate, it should be understood that the first assembly alignment mechanism may alternatively comprise a plate formed from ceramic materials and/or carbon. In still other embodiments the first assembly alignment mechanism 204 may be integrally formed in the alignment fixture 200, particularly when the alignment fixture is formed from carbon, ceramic materials or glass.

Referring to FIG. 3A, in one embodiment the alignment fixture 200 further comprises a vibratory source 220 which is fixedly attached to the fixture body 206. The vibratory source 220 may comprise an ultrasonic transducer constructed of a piezo-electric material or a similar source for imparting vibratory energy to the alignment fixture. In the embodiment shown in FIG. 3A the vibratory source 220 is attached to a side 222 of the fixture body 206 adjacent to the assembly surface 202. However, in other embodiments the vibratory source may be attached to the side 224 of the fixture body adjacent to the first assembly alignment mechanism or the bottom 226 of the fixture body. The vibratory source 220 is activated during the process of aligning the OECA with a substrate thereby vibrating the alignment fixture. Vibrating the alignment fixture assists in (i) overcoming the frictional force between the substrate and the assembly surface 202 as the substrate is advanced along the assembly surface 202 towards the contact face 208 of the first assembly alignment mechanism; (ii) provides suitable 2 point contact between the assembly surface 202 and the contact face 208.

While FIG. 3A depicts the alignment fixture 200 as comprising a vibratory energy source fixedly attached to the fixture body 206, in alternative embodiments (not shown), the alignment fixture may be placed on a vibratory platform during the alignment process. The vibratory platform may be used to impart vibratory energy to the alignment fixture 200 during the alignment process which assists in overcoming the frictional forces between the assembly surface 202 and the substrate, as described above.

Figure 3B:
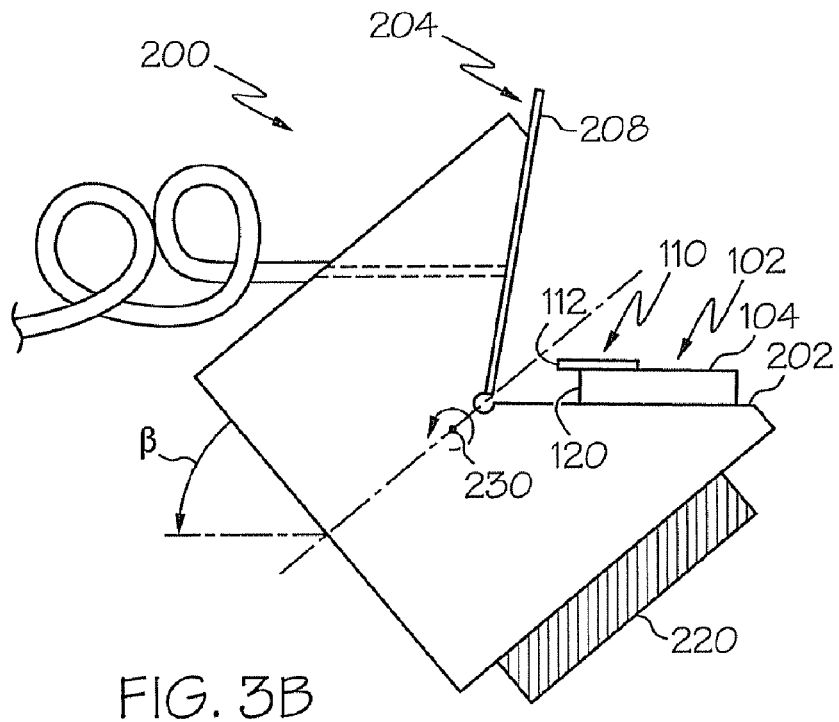
Figure 3C:
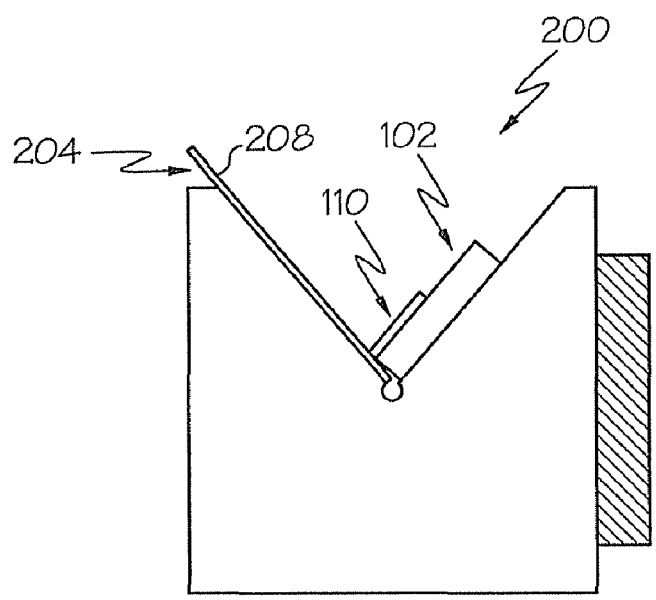

Referring now to FIGS. 3A-3C and 4, one embodiment of a method for aligning the OECA 110 on the substrate 102 with the alignment fixture 200 is schematically illustrated. The alignment fixture 200 is first oriented such that the assembly surface 202 is substantially horizontal which, in FIGS. 3A-3C, is parallel to the x-y plane of the illustrated coordinate axes. Orienting the alignment fixture 200 is accomplished by rotating the alignment fixture 200 about its axis of rotation 230 which is parallel to the y-axis of the coordinate system.

Thereafter, a substrate 102 is positioned on the assembly surface such that the bottom surface (not shown) of the substrate 102 is in contact with the assembly surface 202 and the first substrate alignment face 120 is facing the contact face 208 of the first assembly alignment mechanism 204. When the assembly surface 202 is divided into a plurality of slots, as described above, the substrate 102 may be positioned in one of the slots and oriented with respect to the assembly surface 202 and the first assembly alignment mechanism 204 as described hereinabove. In one embodiment, positioning the substrate 102 on the assembly surface 202 may be performed with a conventional pick-and-place machine or apparatus. In other embodiments positioning of the substrate may be performed manually.

Figure 4:
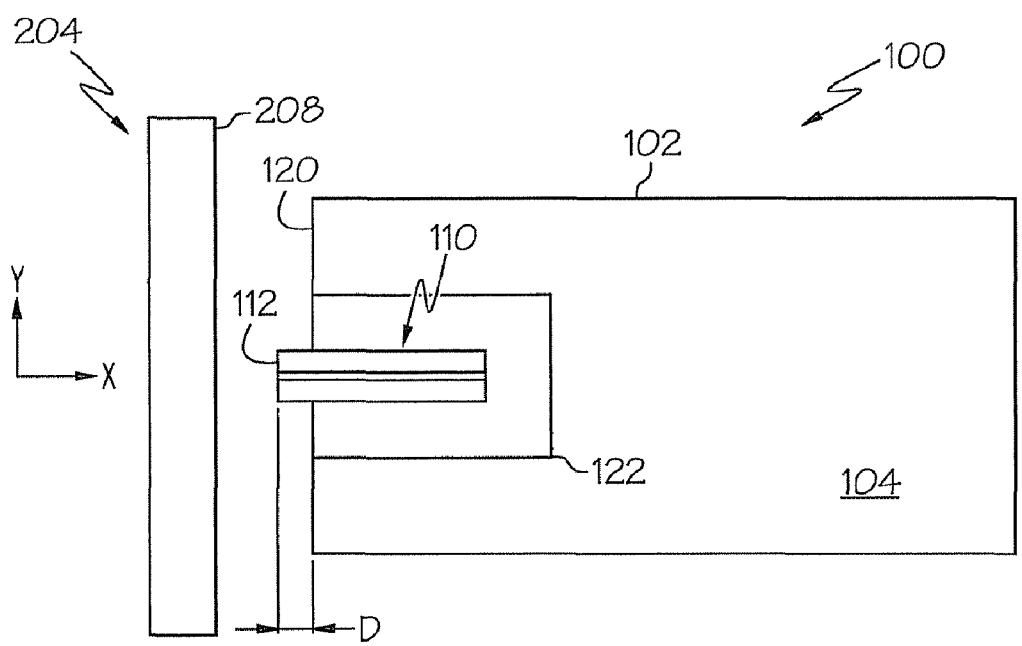
FIG. 4 depicts the relative orientations of the substrate, the opto-electronic component assembly, and the alignment fixture prior to alignment of the opto-electronic component assembly with the substrate according to at least one embodiment shown and described herein.

Thereafter, the OECA 110 is positioned on the top surface 104 of the substrate 102 and, more specifically, on the pad 122 on the top surface 104 of the substrate 102. The OECA 110 may be positioned on the substrate 102 with a conventional pick and place machine or apparatus. The OECA 110 is positioned on the pad 122 such that the OECA alignment face 112 is facing the contact face 208 of the first assembly alignment mechanism 204 and projects from the first substrate alignment face 120 by an amount D, as shown in FIG. 4. In one embodiment, the amount D may be from about 20 microns to about 50 microns. However, it should be understood that the amount D may vary depending on the desired final relative orientation of the OECA alignment face 112 with the first substrate alignment face 120 as determined by the angle α between the contact face 208 and the assembly surface 202.

Once the OECA 110 is positioned on the substrate 102, the substrate 102 and OECA 110 are advanced along the assembly surface 202 towards the first assembly alignment mechanism 204 such that the first substrate alignment face 120 and the OECA alignment face contact the contact face 208 of the first assembly alignment mechanism 204.

In one embodiment, the substrate 102 and OECA 110 are advanced on the assembly surface 202 towards the contact face 208 by gravity. This may be accomplished by rotating the alignment fixture 200 about the axis of rotation 230 in the counter clockwise direction in the embodiment shown in FIG. 3B. Rotating the alignment fixture through the angle β shown in FIG. 3B increases the angle of inclination of the assembly surface with respect to the x-y plane and, in turn, causes the substrate 102 and OECA 110 to advance towards the contact face 208 of the first assembly alignment mechanism 204 under the influence of gravity. The final orientation of the fixture and the OECA and substrate using the gravity-assist technique are depicted in FIG. 3C. Vibratory energy may be applied to the alignment fixture 200 with the vibratory source 220 or an external source to assist in (i) overcoming the frictional forces between the substrate and the assembly surface 202 thereby promoting gravity-assisted sliding of the substrate 102 on the assembly surface 202; and/or (ii) to properly align the substrate 102 with the contact face 208.

Figure 5:
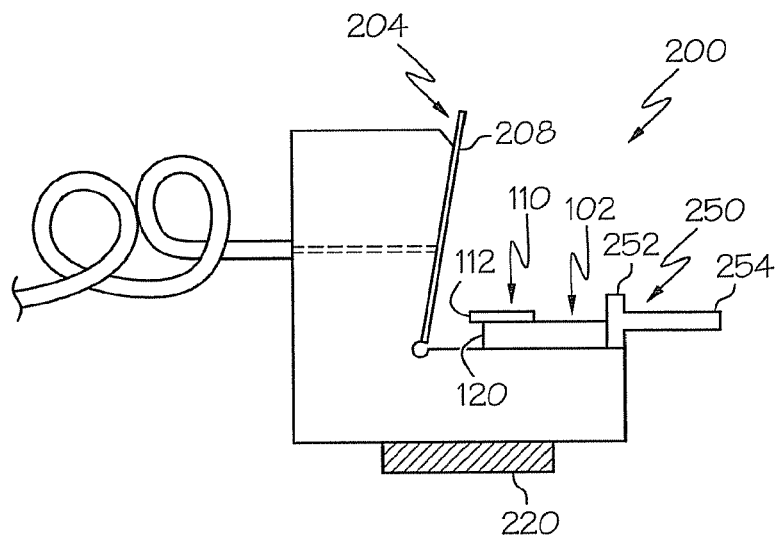
FIG. 5 depicts an alignment fixture and positioning mechanism for advancing the substrate and opto-electronic component assembly towards a contact face of an assembly alignment mechanism according to at least one embodiment shown and described herein.

Referring now to FIG. 5, in another embodiment, the substrate 102 and the OECA 110 are advanced on the assembly surface 202 towards the contact face 208 mechanically. For example, a mechanical advancing mechanism 250 may be brought into contact with the substrate 102 such that the mechanical advancing mechanism 250 urges the substrate 102 towards the contact face 208. The mechanical advancing mechanism 250 may comprise a contact head 252 coupled to a drive arm 254. The drive arm 254 may be mechanically actuated, pneumatically actuated or electromechanically actuated and operable to retract and extend in the x-direction thereby pressing the contact head 152 against the substrate 102 and advancing the substrate 102 and OECA 110 towards the contact face 208. In one embodiment, vibratory energy may be applied to the alignment fixture 200 as the substrate 102 is advanced to assist in overcoming the frictional forces between the assembly surface 202 and the substrate 102 as described above. The vibratory energy may be applied with the vibratory source 220 or with an external source, such as when the alignment fixture 200 is positioned on a vibratory platform or otherwise coupled to a source of vibratory energy. However, it should be understood that, when the substrate 102 and the OECA 110 are advanced on the assembly surface 202 with a mechanical advancing mechanism, the application of vibratory energy is optional as the force exerted on the substrate 202 by the mechanical advancing mechanism may be sufficient to overcome the frictional forces between the substrate 102 and the assembly surface 202.

In either embodiment, the OECA alignment face 112 makes at least two point contacts with the contact face 208 before the first substrate alignment face 120 contacts the contact face 208 due to the initial relative positioning of the OECA alignment face 112 and the first substrate alignment face 120. However, after the OECA alignment face 112 contacts the contact face 208, the substrate 102 continues to advance towards the contact face 208 thereby displacing the OECA 110 relative to the substrate 102 and, more specifically, relative to the first substrate alignment face 120. The substrate 102 is advanced towards the contact face 208 until the first substrate alignment face 120 makes at least two point contacts with the contact face 208 of the first assembly alignment mechanism 204.

As described herein, each of the OECA alignment face 112 and the first substrate alignment face 120 make at least two point contacts with the contact face 208 of the first assembly alignment mechanism 204. The at least two point contacts limit the movement of each of the OECA 110 and the substrate 102 in the direction of the contact face 208 of the first assembly alignment mechanism 204. Further, it should also be understood that the point contacts between the contact face 208 and each of the OECA 110 and substrate 102 also restrict or prevent rotation of the substrate 102 with respect to the assembly surface 202 and rotation of the OECA 110 with respect to the assembly surface 202 and the substrate 102. Accordingly, it should be understood that the at least two point contacts between the OECA alignment face 112 and the contact face 208 restrict the movement of the OECA 110 in more than one degree of freedom (i.e., lateral motion in the direction of the contact face and rotational motion relative to the substrate and/or assembly surface) on the substrate. Similarly, it should be understood that the at least two points of contact between the first substrate alignment face 120 and the contact face 208 restrict the movement of the substrate 102 in more than one degree of freedom (i.e., lateral motion in the direction of the contact face and rotational motion relative to the and assembly surface) on the assembly surface. The controlled application of vibratory energy facilitates overcoming the friction/stiction forces between the substrate and the assembly surface and facilitates reproducible alignment of the OECA and substrate faces with the assembly alignment mechanism.

The relative alignment between the OECA 110 and the substrate 102 is determined by the angle $\alpha$ between the assembly surface 202 and the contact face 208 of the first alignment assembly mechanism 204. When the angle $\alpha$ is greater than 90° the OECA 110 will project from the first substrate alignment face 120 of the substrate 102 following alignment (i.e., the OECA 110 projects from an edge of the substrate 102). However, when the angle $\alpha$ is less than 90°, the OECA 110 is recessed from the first substrate alignment face 120 of the substrate 102 (i.e., the OECA 110 is offset from the edge of the substrate 102) following alignment. When the angle $\alpha$ is 90° the first substrate alignment face 120 and the OECA 110 are aligned in a plane perpendicular to the assembly surface 202 of the alignment fixture 200.

After the OECA 110 is aligned with the substrate 102, the OECA 110 may be joined to the substrate 102 with the bonding material forming the pad 122. In one embodiment, to facilitate joining the OECA 110 to the substrate 102, the alignment fixture 200, including the OECA 110 and substrate 102, may be positioned in an oven and heated to a temperature suitable to activate the bonding material of the pad 122. For example, when the bonding material is solder, the oven may be heated to a temperature suitable to reflow the solder. Similarly, where the bonding material is a polymeric material, the oven may be heated to a suitable temperature for curing the material the polymeric material that bonds the OECA 110 to the substrate. In another embodiment, where the bonding material is a UV-curable resin, the oven may be a UV-curing oven which may be used to activate and cure the UV-curable resin thereby fixing the OECA to the substrate.

Based on the foregoing, it should now be understood that the alignment fixture 200 may be used to align the OECA 110 on the substrate 102 in at least one direction. Moreover, it should be understood that when the alignment fixture 200 comprises an assembly surface with a plurality of slots, such as the alignment fixture shown in FIG. 2, a plurality of sub-assemblies comprising a substrate and an OECA may be aligned simultaneously with the alignment fixture. Accordingly, it should be understood that the methods described herein are suitable for high volume production of aligned sub-assemblies.

Further, while the assembly surface and the first assembly alignment mechanism are described herein as being formed or otherwise contained in a single alignment fixture, it should be understood that the methods described herein may be performed with a first assembly alignment mechanism and an assembly substrate which are separate and discrete pieces.

While FIGS. 3A-3C schematically depict a method for aligning on OECA on a substrate in a single direction, it should be understood that the same techniques may be used to align an OECA with a substrate in two directions.

Figure 6A:
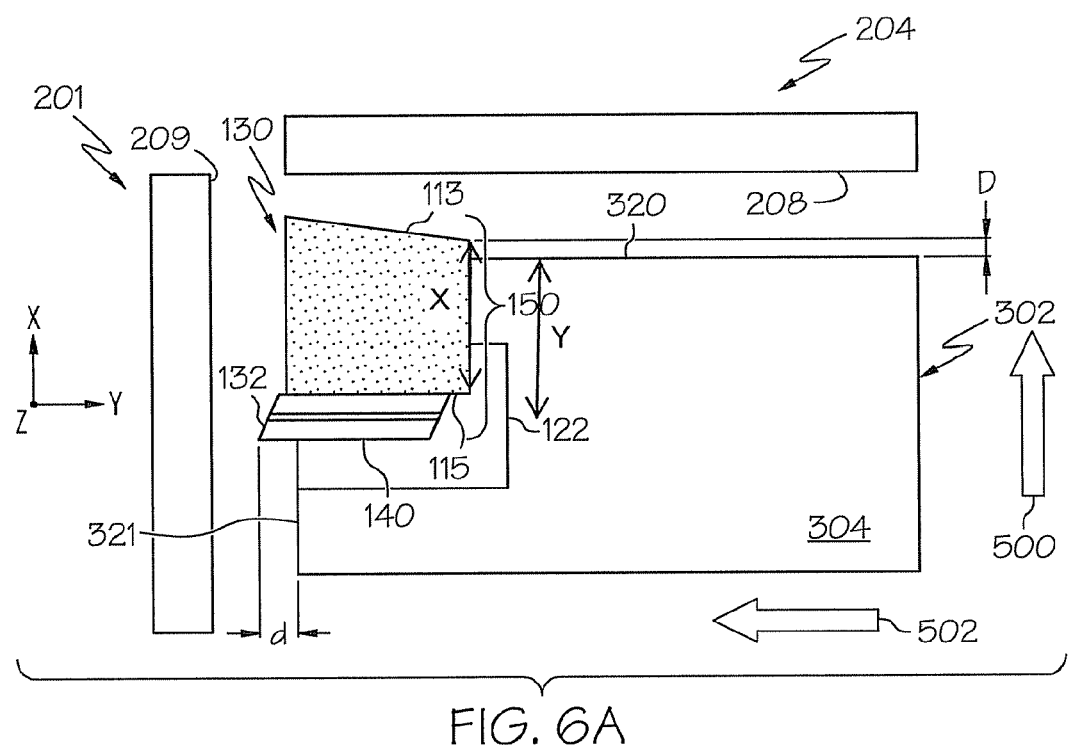
FIG. 6A depicts the relative orientations of a substrate, an opto-electronic component assembly, a first assembly alignment mechanism, and a second assembly alignment mechanism according to one embodiment shown and described herein in which the opto-electronic component assembly is aligned on the substrate in a first direction and a second direction.
Figure 6B:
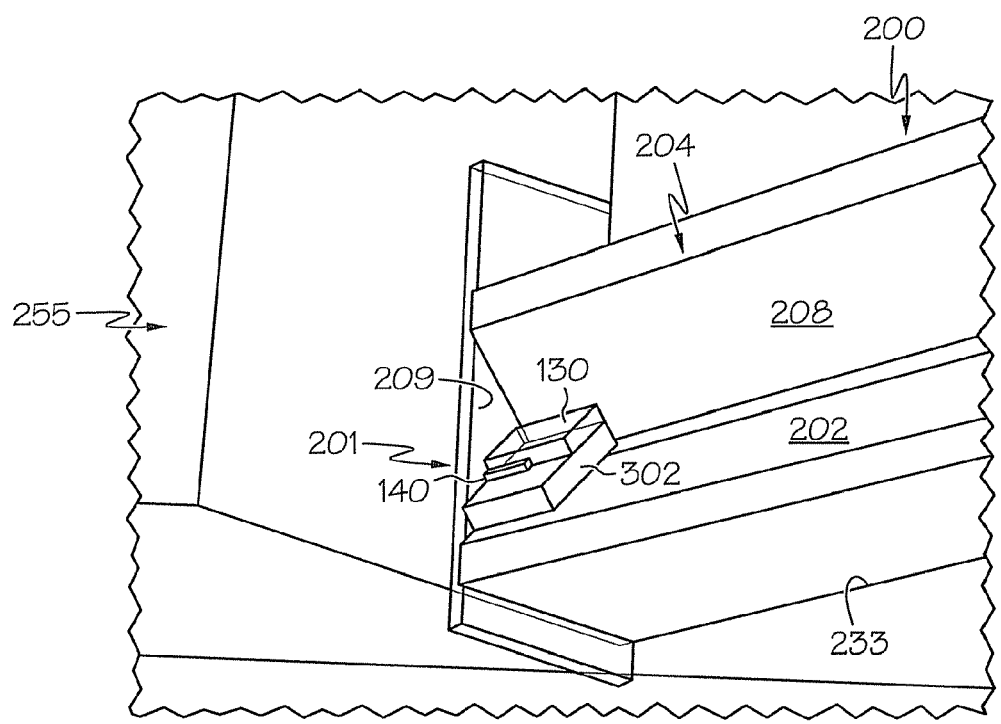
FIG. 6B depicts two alignment fixtures being used to align an opto-electronic component assembly in two directions on a substrate according to at least one embodiment shown and described herein.

Referring now to FIGS. 6A and 6B, one embodiment of a method for aligning an OECA 150 on a substrate 102 in a first direction (e.g., the x-direction) and a second direction (e.g., the y-direction) is graphically illustrated. To facilitate positioning the OECA 150 in both the x-direction and the y-direction, the OECA 150 comprises a removable positioning block 130 and an opto-electronic component 140. In this embodiment, a first assembly alignment mechanism 204 is positioned to align the OECA 150 in the x-direction and a second assembly alignment mechanism 201 is positioned to align the OECA 150 in the y-direction. Accordingly, it should be understood that the first assembly alignment mechanism and the second assembly alignment mechanism of FIG. 6A are perpendicular to one another.

The positioning block 130 may generally be constructed of a material which does not adhere to the bonding material of the pad 122 on the top surface 104 of the substrate 102. This facilitates removal of the positioning block after the opto-electronic component 140 has been bonded to the substrate 102. Accordingly, the positioning block 130 may be made of glass, ceramic, carbon or any other material which will not adhere to the bonding material of the pad 122. In the embodiments shown in FIGS. 6A and 6B the positioning block is glass. The positioning block also comprises a positioning block alignment face which, in this embodiment, is the first OECA alignment face 113. The first OECA alignment face 113 is suitable for making at least a two-point contact with a planar surface. For example, in the embodiment of the positioning block 130 shown in FIG. 6A, the first OECA alignment face 113 is substantially planar. The positioning block 130 may also have a second alignment face, block alignment face 115, which may be generally oriented on the positioning block 130 opposite the first OECA alignment face 113. In the embodiment shown in FIG. 6A the first OECA alignment face 113 is non-parallel with the block alignment face 115 such that the first OECA alignment face has an oblique angle with respect to the block alignment face 115.

The positioning block may have any geometrical form suitable for aligning an optical component on the surface of the substrate. For example, as described above and shown in FIG. 6A, the first OECA alignment face 113 has an oblique angle with respect to the block alignment face 115. An OECA alignment face with such a configuration may be utilized to both displace the optoelectronic component relative to an edge of the substrate as well as rotate the opto-electronic component on the substrate as will be described in more detail herein. This may be used, for example, to align an opto-electronic component 140 on the substrate where the opto-electronic component has oblique end facets, as shown in FIG. 6A.

While the positioning block 130 is described as having an oblique alignment face such that the alignment block is trapezoidal, it should be understood that the positioning block 130 may be rectangular, square of any other suitable geometry or shape for achieving the desired alignment of the opto-electronic component 140 on the substrate. Moreover, it should be understood from the following description that the dimensions of the positioning block may be specifically selected to achieve a desired alignment. For example, it may be desirable to have the opto-electronic component parallel to and offset from the first substrate alignment face 320 by a uniform amount. Accordingly, the positioning block 130 may be substantially square or rectangular with a width in the x-direction which corresponds to the desired offset distance from the first substrate alignment face 320.

The opto-electronic component 140 of the OECA 150 may comprise a waveguide structure or optical crystal as described hereinabove. For example, the opto-electronic component 140 may comprise a periodically poled lithium niobate (PPLN) second harmonic generator (SHG) photonic crystal or a similar crystal operable to convert an input beam of coherent light to a higher order harmonic output beam. In the embodiment shown in FIG. 6A the opto-electronic component has oblique end facets one of which may be utilized as a second OECA alignment face 132 which is suitable for making at least a two-point contact with a planar surface. In the embodiment of the opto-electronic component shown in FIG. 6A, the second OECA alignment face 132 is a planar facet, such as an input facet or an output facet.

The substrate 302 on which the OECA 150 is positioned and aligned generally comprises a plate constructed of metallic or ceramic materials, as described above. The substrate generally comprises a planar top surface 304 on which the OECA 150 is positioned and a bottom surface (not shown) which contacts the assembly surface 202. The substrate 102 generally comprises a first substrate alignment face 320 and a second substrate alignment face 321, both of which are operable to form at least a two-point contact with a planar surface. For example, in the embodiment shown in FIG. 6A, the substrate 302 is a rectangular plate and the first substrate alignment face 320 is one side of the rectangular plate and the second substrate alignment face 321 is a second side of the rectangular plate perpendicular to the first such that the first and second substrate alignment faces 320, 321 are planar. The substrate 302 may also comprise a pad 122 of bonding material located on the top surface 104 as described hereinabove.

Referring to FIG. 6A, in order to position the OECA 150 in a first direction (i.e., the x-direction) and a second direction (i.e., the y-direction), the substrate 302 is first positioned on the assembly surface such that the first substrate alignment face 320 is facing the contact face 208 of the first assembly alignment mechanism 204 and the second substrate alignment face 321 is facing the contact face 209 of the second assembly alignment mechanism 201. Positioning the substrate 302 with this orientation may be accomplished using a conventional pick and place apparatus.

Thereafter, the positioning block 130 is positioned on the top surface 304 of the substrate 302 such that the first OECA alignment face 113 faces the contact face 208 of the first assembly alignment mechanism 204 and projects from the first substrate alignment face 320. The first OECA alignment face 113 may project a distance D from the first substrate alignment face 120 by about 20 microns to about 50 microns, as described above. As with the substrate 302, the positioning block 130 may be positioned on the substrate 102 with a conventional pick and place machine.

The opto-electronic component 140 is positioned on the top surface 304 of the substrate 102 such that the opto-electronic component 140 abuts block alignment face 115 of the positioning block 130 opposite the first OECA alignment face 113. Accordingly, it should be understood that, when the first OECA alignment face 113 is non-parallel with the opposite face of the positioning block, the opto-electronic component 140 will also be non-parallel with the first OECA alignment face 113 and, when the first OECA alignment face 113 is parallel with the opposite face of the positioning block 130, the opto-electronic component 140 will also be parallel with the first OECA alignment face 113. The positioning block 130 in this embodiment has a rear surface with a dimension (width) X. And the center of the opto-electronic component 140 (e.g. waveguide axis or an axis of an optical crystal is positioned at a predetermined distance or offset Y from the edge of the first alignment face 320. By choosing the X dimension properly, distance Y will position the opto-electronic component 140 at a predetermined position on the top surface 304 of the substrate 302. The opto-electronic component 140 is also positioned on the substrate 302 such that the second OECA alignment face 132 (i.e., an end facet of the opto-electronic component) faces the contact face 209 of the second assembly alignment mechanism 201 and projects from the second substrate alignment face 321 by an amount d which may be from about 20 microns to about 50 microns. The opto-electronic component 140 is generally positioned on the substrate 102 such that, when the opto-electronic component is aligned on the substrate, the opto-electronic component is positioned on the pad 122. Positioning the opto-electronic component 140 may be performed with a pick and place machine, as described above.

Once the opto-electronic component 140 is positioned on the substrate 302, the substrate 302 and the OECA 150 are advanced towards the contact face 208 of the first assembly alignment mechanism 204 (as indicated by arrow 500) in order to align the OECA 150 on the surface of the substrate 302 in a first direction which, in this example, is the x-direction. In one embodiment, the substrate and the OECA 150 are advanced towards the contact face 208 under the influence of gravity, as described hereinabove. For example, in order to advance the substrate 302 and OECA 150 towards the contact face 208, the assembly surface may be tilted about an axis of rotation which is substantially parallel to the y-axis such that the substrate 302 is tilted towards the contact face 208. Alternatively, the substrate 302 and the OECA 150 may be advanced towards the contact face 208 with a mechanical advancing mechanism (not shown) as described hereinabove. In either embodiment, vibratory energy may be applied to the assembly surface to assist in overcoming the frictional forces between the substrate 302 and the assembly surface.

As the substrate 302 and the OECA 150 are advanced towards the contact face 208, the first OECA alignment face 113 makes at least two point contacts with the contact face 208 before the first substrate alignment face 320 contacts the contact face 208 due to the initial relative positioning of the first OECA alignment face 113 and the first substrate alignment face 320. However, after the first OECA alignment face 113 contacts the contact face 208, the substrate 302 continues to advance towards the contact face 208 thereby displacing the OECA 150 relative to the substrate 302 and, more specifically, relative to the first substrate alignment face 320. Accordingly, both the positioning block 130 and the opto-electronic component 140 are displaced in the x-direction relative to the first substrate alignment face 320. The substrate 302 is advanced towards the contact face 208 until the first substrate alignment face 320 makes at least two point contacts with the contact face 208 of the first assembly alignment mechanism 204.

When the first OECA alignment face 113 is non-parallel with the contact face 208 as shown in FIG. 6A, advancing the first OECA alignment face 113 against the contact face 208 causes the positioning block to rotate on the top surface 304 of the substrate 302 which, in turn, causes the opto-electronic component 140 to also rotate on the top surface 304 of the substrate 302. This is particularly useful for positioning an opto-electronic component 140 with oblique end facets such that the second OECA alignment face 132 is parallel with the second substrate alignment face 321.

After the OECA 150 is positioned in the first direction, the substrate 302 and the OECA 150 are advanced towards the contact face 209 of the second assembly alignment mechanism 201 (as indicated by arrow 502) in order to align the OECA 150 on the surface of the substrate 302 in a second direction which, in this example, is the y-direction. The substrate 302 and the OECA 150 are advanced towards the contact face 208 either mechanically or under the influence of gravity. For example, in order to advance the substrate 302 and OECA 150 towards the contact face 209, the assembly surface may be tilted about an axis of rotation which is substantially parallel to the x-axis such that the substrate 302 is tilted towards the contact face 209.

As the substrate 302 and the OECA 150 are advanced towards the contact face 209, the second OECA alignment face 132 makes at least two point contacts with the contact face 209 before the second substrate alignment face 321 contacts the contact face 209 due to the initial relative positioning of the second OECA alignment face 132 and the second substrate alignment face 321. However, after the second OECA alignment face 132 contacts the contact face 209, the substrate 302 continues to advance towards the contact face 209 thereby displacing the OECA 150 relative to the substrate 302 and, more specifically, relative to the second substrate alignment face 321. Accordingly, at least the opto-electronic component 140 is displaced in the y-direction relative to the second substrate alignment face 321. The substrate 302 is advanced towards the contact face 209 until the second substrate alignment face 321 makes at least two point contacts with the contact face 209 of the second assembly alignment mechanism 201.

Once the second substrate alignment face contacts the contact face 209 of the second assembly alignment mechanism 201, the OECA 150 is aligned on the substrate 302 in both a first direction and a second direction. The opto-electronic component 140 may then be joined to the substrate 302 using the bonding material forming the pad 122 as described above. However, it will be understood that the positioning block 130 does not bond to the pad 122 and thus the positioning block 130 may be removed from the substrate after the opto-electric component is bonded to the substrate 302.

Referring now to FIG. 6B, the method for aligning the OECA 150 on the substrate 302 may be performed with two alignment fixtures 200, 205 similar to the alignment fixture depicted in FIG. 2. The substrate 302, positioning block 130 and opto-electronic component 140 are first positioned on the assembly surface 202 of alignment fixture 200, as described above. The substrate 302 is then advanced against the contact face 208 of the first assembly alignment mechanism 204 to align the opto-electronic component in a first direction. In the embodiment shown in FIG. 6B the substrate 302 is advanced towards the contact face 208 by tilting the alignment fixture 200.

Thereafter, the alignment fixture 200 is positioned on the assembly surface 233 of the second alignment fixture 255. This is performed with the alignment fixture 200 oriented such that the assembly surface 233 is substantially horizontal. With the alignment fixture 200 positioned on the second alignment fixture 255, the second alignment fixture is rotated such that the substrate 302 is advanced along the assembly surface 202 towards the contact face 209 of the second assembly alignment mechanism 201 under the influence of gravity. As the substrate 302 and opto-electronic component 140 contact the contact face 209, as described above, the opto-electric component is aligned on the substrate in a second direction.

Figure 7:
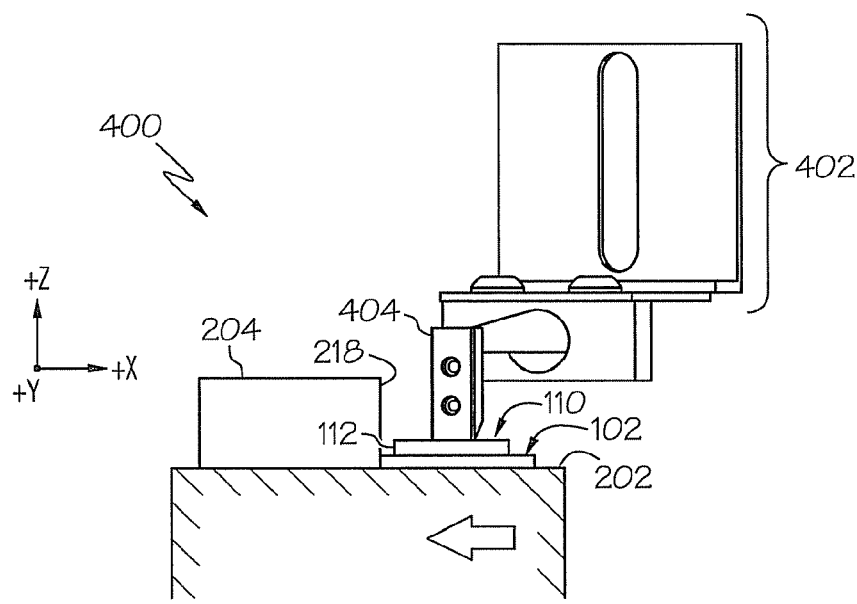
FIG. 7 schematically depicts a method for aligning an opto-electronic component assembly on a substrate according to at least one embodiment shown and described herein.

Referring now to FIG. 7, another embodiment of a method for aligning an OECA 110 on a substrate 102 is schematically illustrated. In this embodiment, the substrate 102 is initially placed on the assembly surface 202 such that the substrate 102 directly contacts the contact face 208 of the first assembly alignment mechanism 204 and forms at least two point contacts with the contact face. Thereafter, the OECA 110 is initially positioned on the top surface of the substrate 102 and generally aligned on the pad (not shown) in the y-direction with the OECA alignment face 112 facing the contact face 208. Initial positioning of the OECA 110 may be performed with a pick and place machine or similar positioning apparatus. Once the OECA is initially positioned, the OECA is advanced over the top surface of the substrate 102 towards the contact face 208. In the embodiment shown in FIG. 7, the OECA is advanced towards the contact face 208 with positioning device 400. The positioning device 400 comprises an attachment head 404 coupled to a support bracket 402. In the embodiment shown in FIG. 7 the attachment head 404 is a vacuum attachment head which is operable to contact and draw a vacuum on the OECA 110. The support bracket 402 may be coupled to a computer numeric control (CNC) positioning system such that the positioning device may be positioned in the x, y and z directions.

To align the OECA 110 on the substrate 102, the attachment head 404 is attached to the OECA 110 by drawing a vacuum on the OECA 110. The magnitude of the vacuum drawn on the OECA may be set such that the contact between the alignment faces in controlled such that, if the contact force exceeds a predetermined value, the attachment head 404 slides with respect to the OECA 110 thereby preventing excessive force on the OECA. This allows for alignment of the OECA 110 with the contact face 208 while preventing damage to the OECA. Similar controlled contact forces may be utilize when the positioning device employs a spring loaded or similar advancing mechanism. Thereafter, the positioning device 400 exerts a downward force (i.e., a force in the z-direction) thereby forcing and flattening the OECA 110 against the top surface of the substrate 102. The positioning device then slides the substrate in the x-direction towards the contact face 208 until the OECA alignment face 112 makes at least a two-point contact with the contact face 208. When the OECA alignment face 112 makes at least a two-point contact with the contact face 208, the attachment head 404 continues to move towards the contact face 208 without imparting any additional motion to the OECA 110 in the x-direction (i.e., the attachment head slides along the OECA 110 but does not move the OECA). Thereafter, the OECA 110 may be joined to the substrate 102 as described hereinabove.

Based on the foregoing, it should now be understood that the techniques described herein may be used to align an opto-electronic component or components on a substrate with a high degree of alignment precision and repeatability. For example, the methods described herein enable opto-electronic components to be positioned on a substrate with a repeatable precision of less than about 1 micron and as low as 0.5 microns. Further, the fixtures used to perform the method may be easily produced at low cost and are readily scalable. Accordingly, it should be understood that the methods and fixtures described herein may be easily adapted for use in high volume manufacturing operations at significantly lower costs than the machine vision based die-bonders currently employed without sacrificing alignment precision. Indeed, the alignment precision of the methods described herein is actually an improvement over present technologies at a significantly lower cost.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method for aligning an opto-electronic component assembly on a substrate, the method comprising:
   positioning the substrate on an assembly surface;
   positioning an opto-electronic component assembly (OECA) on the substrate such that a first OECA alignment face projects from a first substrate alignment face; and
   advancing the substrate and the OECA towards a contact face of a first assembly alignment mechanism such that the first substrate alignment face contacts the contact face of the first assembly alignment mechanism after the first OECA alignment face contacts the contact face of the first assembly alignment mechanism, wherein:
      a contact between the first substrate alignment face and the contact face of the first assembly alignment mechanism is at least a two point contact which limits movement of the substrate on the assembly surface in more than one degree of freedom;
      a contact between the first OECA alignment face and the contact face of the first assembly alignment mechanism is at least a two point contact which limits movement of the opto-electronic component assembly on the substrate in more than one degree of freedom; and
      the OECA is displaced relative to the first substrate alignment face when the first OECA alignment face contacts the contact face of the first assembly alignment mechanism and the substrate continues to move towards the contact face of the first assembly alignment mechanism thereby aligning the OECA on the substrate relative to the first substrate alignment face.

2. The method of claim 1 wherein the substrate is advanced towards the contact face of the first assembly alignment mechanism by tilting the assembly surface.

3. The method of claim 1 wherein the substrate is advanced towards the contact face of the first assembly alignment mechanism with a positioning device.

4. The method of claim 1 wherein the OECA is selected from the group consisting of laser diodes and optical crystals.

5. The method of claim 1 wherein an angle between the contact face of the first assembly alignment mechanism and the assembly surface is from about 60° to about 120°.

6. The method of claim 1 wherein the contact face of the first assembly alignment mechanism is glass.

7. The method of claim 1 further comprising vibrating the assembly surface as the substrate is advanced towards the contact face of the first assembly alignment mechanism.

8. The method of claim 1 wherein:
   the OECA is positioned on a bonding material applied to the substrate; and
   the method further comprises heating the assembly surface, the substrate and the OECA to bond the OECA to the substrate.

9. The method of claim 1 wherein the assembly surface is one side of a V-groove in an alignment fixture and the first assembly alignment mechanism is oriented on an opposing side of the V-groove.

10. The method of claim 9 wherein the alignment fixture comprises a relief channel at a vertex of the V-groove.

11. The method of claim 9 wherein the assembly surface comprises a plurality of slots.

12. The method of claim 1 wherein:
   the opto-electronic component assembly comprises an opto-electronic component and a positioning block;
   the first OECA alignment face is a positioning block alignment face;
   the OECA is positioned on the substrate such that a second OECA alignment face projects from a second substrate alignment face; and
   the method further comprises advancing the substrate and the OECA towards a contact face of a second assembly alignment mechanism such that the second substrate alignment face contacts the contact face of the second assembly alignment mechanism after the second OECA alignment face contacts the contact face of the second assembly alignment mechanism, wherein:
      a contact between the second substrate alignment face and the contact face of the second assembly alignment mechanism is at least a two point contact which limits movement of the substrate on the assembly surface in more than one degree of freedom;
      a contact between the second OECA alignment face and the contact face of the second assembly alignment mechanism is at least a two point contact which limits relative movement of the OECA on the substrate in more than one degree of freedom; and
      the opto-electronic component is displaced relative to the second substrate alignment face when the second OECA alignment face contacts the contact face of the second assembly alignment mechanism and the substrate continues to move towards the contact face of the second assembly alignment mechanism.

13. The method of claim 12 wherein the opto-electronic component is non-parallel with the first substrate alignment face when the first substrate alignment face contacts the contact face of the first assembly alignment mechanism.

14. The method of claim 12 wherein the substrate is advanced towards the first assembly alignment mechanism by tilting the assembly surface about a first axis and the substrate is advanced towards the second assembly alignment mechanism by tilting the assembly surface about a second axis.

15. A method for aligning an opto-electronic component assembly on a substrate, the method comprising:

positioning the substrate on an assembly surface such that a substrate alignment face contacts a contact face of an assembly alignment mechanism;

positioning an opto-electronic component assembly (OECA) on the substrate such that the OECA is substantially aligned in a first direction;

advancing the OECA towards the contact face of the assembly alignment mechanism until an OECA alignment face of the OECA contacts the contact face of the assembly alignment mechanism thereby aligning the OECA on the substrate in a second direction, wherein:

a contact between the substrate alignment face and the contact face of the assembly alignment mechanism is at least a two point contact which limits movement of the substrate on the assembly surface in more than one degree of freedom; and a contact between the first OECA alignment face and the contact face of the assembly alignment mechanism is at least a two point contact which limits movement of the opto-electronic component assembly on the substrate in more than one degree of freedom.

16. The method of claim 15 wherein the OECA is advanced towards the contact face of the assembly alignment mechanism with a positioning device.

17. The method of claim 15 further comprising vibrating the assembly surface as the OECA is advanced towards the assembly alignment mechanism.

18. The method of claim 15 wherein the OECA comprises an optical crystal.

19. The method of claim 15 wherein the OECA is pressed against the substrate as OECA is advanced towards the assembly alignment mechanism.

20. The method of claim 15 wherein an angle between the contact face of the assembly alignment mechanism and the assembly surface is from about 60 degrees to about 120 degrees.

* * * * *